United States Patent
Nakayama et al.

[11] Patent Number: 5,877,553
[45] Date of Patent: Mar. 2, 1999

[54] METALLIC ELECTRONIC COMPONENT PACKAGING ARRANGEMENT

[75] Inventors: Osamu Nakayama; Koji Ishikawa, both of Kanagawa-ken, Japan

[73] Assignee: NHK Spring Co., Ltd., Kanagawa-ken, Japan

[21] Appl. No.: 739,662

[22] Filed: Oct. 31, 1996

[30] Foreign Application Priority Data

| Oct. 31, 1995 | [JP] | Japan | 7-306720 |
| Mar. 6, 1996 | [JP] | Japan | 8-079435 |
| Aug. 21, 1996 | [JP] | Japan | 8-238612 |

[51] Int. Cl.$^6$ .................................................. H01L 23/043
[52] U.S. Cl. ................ 257/708; 257/687; 257/709; 257/717; 361/728; 361/756
[58] Field of Search .................... 257/708, 709, 257/717, 687, 784; 361/728, 732, 756

[56] References Cited

U.S. PATENT DOCUMENTS

| 4,314,270 | 2/1982 | Iwatani | 257/708 |
| 4,381,469 | 4/1983 | Ogawa et al. | 257/417 |
| 4,577,056 | 3/1986 | Butt | 257/709 |
| 4,663,649 | 5/1987 | Suzuki et al. | 257/746 |
| 5,023,398 | 6/1991 | Mahulikar et al. | 257/708 |
| 5,317,194 | 5/1994 | Sako | 257/717 |
| 5,344,498 | 9/1994 | Inoue | 257/788 |
| 5,367,196 | 11/1994 | Mahulikar et al. | 257/787 |
| 5,552,637 | 9/1996 | Yamagata | 257/717 |
| 5,641,997 | 6/1997 | Ohta et al. | 257/789 |

*Primary Examiner*—David Ostrowski
*Attorney, Agent, or Firm*—Skjerven Morrill MacPherson Franklin and Friel LLP; Thomas S. MacDonald

[57] ABSTRACT

In a packaging arrangement suitable for semiconductor devices, a semiconductor chip is mounted on a surface of an aluminum base with a bonding layer interposed therebetween. The aluminum base has a capability to favorably dissipate heat from the semiconductor chip. The bonding layer consists of a resilient and heat conductive material such as silicone resin mixed with silver powder so that thermal strain of the metal base is accommodated by the resiliency of the bonding layer, and is prevented from adversely affecting the electronic component chip even though the aluminum base demonstrates a substantially more significant thermal expansion than the semiconductor chip. It is therefore possible to achieve a high reliability in the packaging of semiconductor devices at a minimum cost.

5 Claims, 4 Drawing Sheets

METALLIC ELECTRONIC COMPONENT PACKAGING ARRANGEMENT

TECHNICAL FIELD

The present invention relates to a packaging arrangement for electronic components such as semiconductor devices of a wide range of integration density, and in particular to such a packaging arrangement using a metal base.

BACKGROUND OF THE INVENTION

Conventionally, most of the packages for semiconductor devices consisted of a ceramic pin grid array (CPGA) or a plastic pin grid array (PPGA). The CPGA is relatively expensive while the PPGA is known to be relatively less reliable and poor in its capability to dissipate heat. For these reasons, the metal pin grid array (MPGA) and the metal ball grid array (MBGA) are being preferred. They are based on the use of a metal base and a metal cover, and are considered to be equally reliable as the CPGA, and have an even better heat dissipating capability than the CPGA. Furthermore, the MPGA and the can be made as economical as the PPGA by suitably selecting the materials for the package. In the MPGA and the MBGA, a semiconductor chip is normally placed on the metal base, and an annular circuit board provided with a circuit pattern is placed around the semiconductor chip. The pads provided on the semiconductor chip are connected to the associated pads of the circuit board by bonding wires.

As the density of semiconductor integration is progressively increased in recent years, the density of the circuit pattern of the circuit board has to be accordingly increased, and this leads to the increase in the line length of the electroconductive strips of the circuit pattern, and the reduction in the pattern width and the gap between adjacent electroconductive strips. Therefore, degradation in high frequency properties or an increase in the signal time delays, and an increase in the noise level, resulting from such a trend, can become a problem. Furthermore, the progressively increasing clock speed of the CPU and other semiconductor devices even further compounds such a problem.

Another important problem in the MPGA and the MBGA is the precision in the positioning of the semiconductor chip on the metal base. It is conceivable to place a buffer layer made of ceramic material such as alumina $Al_2O_3$, or molybdenum (Mo) between the semiconductor chip and the metal base. These materials have thermal expansion coefficients which are comparable to that of silicon (alumina 7.3 $\mu/°C$. molybdenum 5.0 $\mu/°C$., and silicon 3.5 $\mu/°C$.). However, the number of component parts has to be undesirably increased, and the overall structure becomes undesirably complex. As a result, the cost is increased, and the heat dissipating capability is diminished.

It is also conceivable to use CuW and AlN, having the thermal expansion coefficients of 6.0 $\mu/°C$. and 4.9 $\mu/°C$., respectively, for the base as they have a favorable heat dissipating capability and their thermal expansion coefficients are comparable to that of silicon. However, these materials are too costly for practical use. CuW cost about 120 times and AlN cost about 260 times more than Al.

These problems also apply to those semiconductor devices mounted on a metallic circuit board. The following table compares the properties and costs of various materials.

TABLE 1

| materials | | coefficients of thermal conduction (W/m°·K) | coefficients of thermal expansion ($\mu/°C$.) | specific weight | cost (*1) |
|---|---|---|---|---|---|
| metals | Al | 237 | 23.0 | 2.7 | 1 |
|  | Cu | 398 | 16.0 | 8.9 | 3.2 |
|  | Fe | 80 | 12.0 | 7.9 | 0.4 |
|  | CuW | 210 | 6.0 | 17.0 | 120 |
| ceramics | $Al_2O_3$ | 20 | 7.3 | 3.8 | 80 |
|  | AlN | 170 | 4.9 | 3.3 | 260 |
| resin | epoxy + glass | 0.3 | 15–17 | 1.85 | 0.2 |
| semiconductor | Si | 150 | 3.5 | 2.3 | — |

(*1) As compared to the cost of Al.

In the MPGA and the MBGA, the semiconductor chip is typically attached to the metal base by using solder or an epoxy bonding agent. When economical metal material such as aluminum is used, although it has a favorable heat dissipating property, because of the large difference in the thermal expansion coefficients of the semiconductor chip made of silicon (with the thermal expansion coefficient of 3.5 $\mu/°C$.) and the metal base made of aluminum (with the thermal expansion coefficient of 23 $\mu/°C$.), the semiconductor chip is subjected to a significant thermal stress. As a result, the integrated circuit in the semiconductor chip may fail to operate properly, or even cracks may develop in the semiconductor chip. This can seriously impair the reliability of the semiconductor chip.

BRIEF SUMMARY OF THE INVENTION

In view of such problems of the prior art, a primary object of the present invention is to provide an improved electronic component packaging arrangement which is economical but reliable in use by virtue of the reduction in the thermal strain that may be applied to the electronic component.

A second object of the present invention is to provide an improved electronic component packaging arrangement which is simple and easy to make.

A third object of the present invention is to provide an improved electronic component packaging arrangement which has a favorable heat dissipating property.

A fourth object of the present invention is to provide an improved electronic component packaging arrangement which is suitable for semiconductor devices such as integrated circuits.

According to the present invention, these and other objects can be accomplished by providing a metallic electronic component packaging arrangement, comprising: a metal base made of metal or alloy; an electronic component chip securely mounted on the metal base with a bonding layer interposed between the chip and the metal base; a circuit board placed on the metal base adjacent to the electronic component chip; and a bonding wire connected between a pad provided on the electronic component chip and a pad provided on the circuit board; the bonding layer interposed between the metal base and the chip consisting of a resilient and heat conductive material which can prevent thermal strain of the metal base from adversely affecting the electronic component chip.

Because the bonding layer accommodates the thermal expansion of the metal base without causing any excessive strain to the electronic component chip, the metal base may be made of heat conductive and economical materials such as aluminum or aluminum-based alloys which are known to have high thermal expansion coefficients. To achieve this goal, the resilient and heat conductive material preferably has (1) a Young's modulus of 1,000 kgf/cm$^2$ or less, (2) an elongation of 30% or more, and (3) a bonding force of 10 kgf/cm$^2$ or more, and (4) a thermal conductivity of 1.0 W/m·K or more. This can be readily accomplished by using silicone resin mixed with metal powder for the resilient and heat conductive material. The metal powder preferably consists of silver, but other good conductors of heat and/or electric current can be also used for the filler material of the bonding layer.

Grounding accounts for a large number of bonding wires in semiconductor devices. The bonding layer may provide a path for grounding if it is sufficiently electroconductive. According to a preferred embodiment of the present invention, the metal base is provided with a projection, and the circuit board is provided with a through hole which is adapted to receive the projection when the circuit board is mounted on the metal base. The engagement between the projection and the associated through hole may serve the dual purpose of locating the circuit board on the metal base and providing a path for connecting a pad of the circuit board to the metal base. For the simplification of the manufacturing process, the projection may be formed by plastic deformation of the metal base, for instance by die press forming.

Because semiconductor chips are known to be vulnerable to excessive heat and strain, the present invention is particularly useful as packaging arrangements for a wide range of semiconductor devices.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
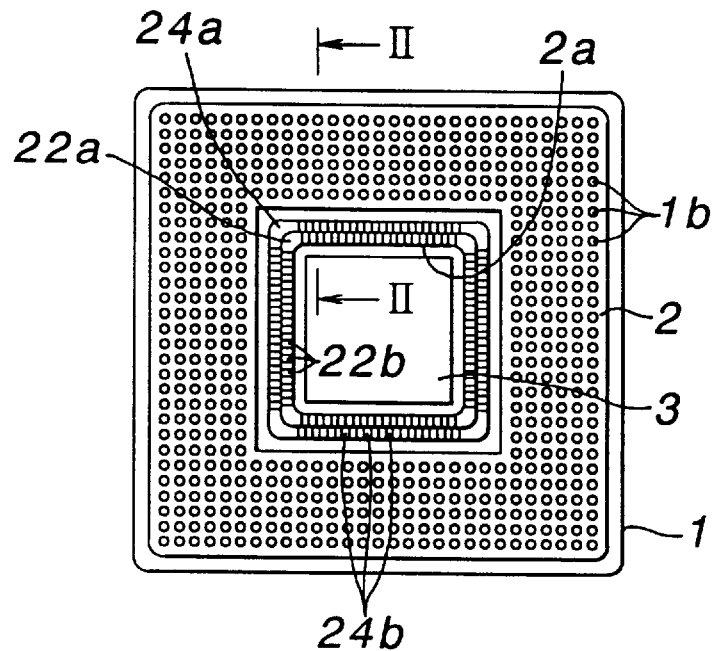
FIG. 1 is a plan view of a first embodiment of the metallic electronic component packaging arrangement according to the present invention constructed as a semiconductor package.
Figure 2:
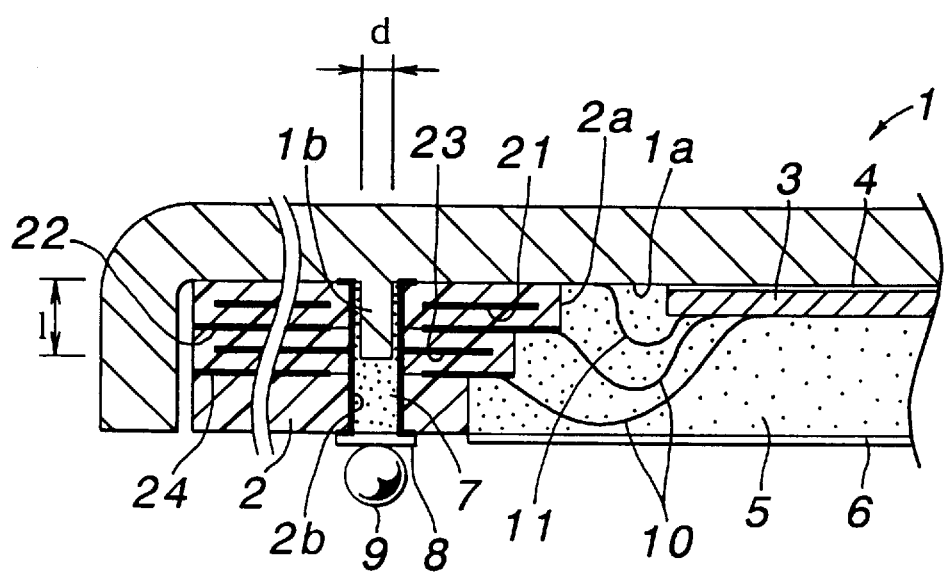
FIG. 2 is a fragmentary sectional view taken along line II—II of FIG. 1.
Figure 3:
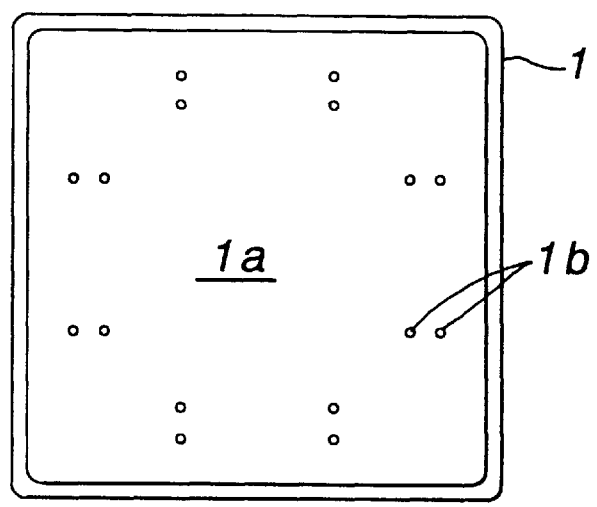
FIG. 3 is a plan view of the metal base of the semiconductor package of FIG. 1.

FIGS. 1 to 3 show a first embodiment of the present invention which is constructed as a metal ball grid array semiconductor package. This semiconductor package is provided with a generally flat and square configuration, and comprises a metal base 1 consisting of an aluminum plate formed into a shallow rectangular pan, and an annular multi-layer circuit board 2, having a rectangular outer periphery and a rectangular central opening 2a, which is attached to the recessed surface 1a of the metal base 1. A semiconductor chip consisting of an IC chip 3 is attached to a part of the recessed surface 1a of the metal base 1 which is exposed by the central opening 2a of the circuit board 2 via a bonding layer 4 consisting of electroconductive silicone resin. A resin sealant 5 is filled into the central opening 2a of the circuit board 2 to thereby encapsulate the IC chip 3 in the resin sealant 5. The outer surface of the resin sealant 5 is covered by a metal cap layer 6. Because the IC chip 3 is attached to the metal base 1 with the bonding layer 4 consisting of the silicone resin layer which serves as a buffer layer, the difference in the thermal expansion coefficient between the metal base 1 and the IC chip 3 is absorbed by the silicone resin bonding layer 4, and the IC chip 3 is protected from any excessive thermal strain.

The bonding layer 4 may consist of film made of any material having some resiliency and a thermal conductivity as long as it is capable of absorbing any difference in the thermal expansion between the metal base and the IC chip so as not to apply any excessive thermal stress to the IC chip 3. This film, when cured, preferably has (1) a Young's modulus of 1,000 kgf/cm$^2$ or less, (2) an elongation of 30% or more, (3) a bonding force of 10 kgf/cm$^2$ or more, and (4) a thermal conductivity of 1.0 W/m·K or more. If the Young's modulus is greater than 1,000 kgf/cm$^2$ or the elongation is less than 30%, the IC chip may be subjected to an excessive thermal stress which may lead to a failure of the IC chip 3 to operate properly. If the bonding force is less than 10 kgf/cm$^2$, repeated cyclic thermal stress that may be applied to the resin bonding layer 4 may lead to the separation of the IC chip 3. If the thermal conductivity is less than 1.0 W/m·K, the resulting insufficiency in heat dissipation may lead to improper operation of the IC chip 3.

More specifically, the resin bonding layer 4 may consist of a silicone bonding agent which is mixed with silver filler for electroconductivity. This bonding agent is applied to the surface of the metal base to the thickness of 20 to 50 $\mu$m, and turns elastomeric upon curing. As long as the preferred range of properties mentioned above is met, the filler which is mixed in the bonding agent may consist of materials other than Ag, or no filler may even be necessary. The thickness of the resin film may be also freely selected from the range of 5 $\mu$m to 500 $\mu$m so as to achieve a required bonding force and thermal conductivity.

The multi-layer circuit board 2 is provided with a number of through holes 2b. A plurality of pins 1b extend upright from the recessed surface 1a of the metal base 1. These pins 1b may be preferably formed by plastic deformation of the material of the metal base 1 although it is also possible to attach separate pins in such an upright arrangement. In this embodiment, the integrally formed pins 1b are each 0.3 mm in diameter and 0.3 mm in length, and 16 of them are arranged in suitable locations of the recessed surface 1a of the metal base 1 as best illustrated in FIG. 3. These pins 1b are fitted into corresponding through holes 2b provided in the circuit board 2 so as to serve as locating means for the circuit board 2. The through holes 2b into which the pins 1b are fitted are later filled by electroconductive paste 7 which electrically connects the pins to lands 8 and solder balls 9 formed on the outer surface of the circuit board 2.

The multi-layer circuit board 2 comprises a power line layer 21, a first circuit layer 22, a ground layer 23 serving as a separating layer for circuit layers, and a second circuit layer 24, in that order from the recessed surface 1a of the metal base 1. The inner periphery of the circuit board 2 surrounding the central opening 2a defines two approximately 1 mm wide steps 22a and 24a which are flush with the first and second circuit layers 22 and 24. Pads 22b and 24b for providing external connections for the corresponding circuit layers 22 and 24 are formed on these steps 22b and 24b, and are connected to corresponding pads 22a and 23a of the IC chip 3 by bonding wires 10. The through holes 2b may be connected to various parts of the first and second circuit layers 22 and 24 and the ground layer 23 via through hole plating applied to the thorough holes as required.

An approximately 1 mm wide gap is defined between the inner periphery of the opening 2a of the circuit board 2 and the outer periphery of the IC chip 3, and the surface of the metal base 1 in this gap is exposed. At least one bonding wire 11 is connected between the IC chip 3 and the exposed surface of this part of the metal base 1. Therefore, the ground line of the IC chip 3 can be connected to an external circuit such as a mother board via the metal base 1, the pins 1b, the through holes 2b (electroconductive paste 7), the lands 8, and the solder balls 9 for re-flow soldering. Normally, the through holes 2b into which the pins 1b are fitted are connected to the ground layer 23 for circuit separation.

Figure 4:
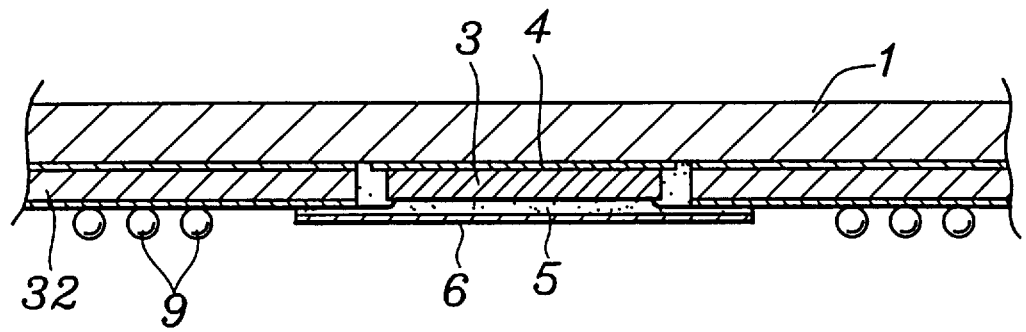
FIG. 4 is a fragmentary sectional view of a second embodiment of the present invention.

FIG. 4 is a sectional view of a second embodiment of the present invention constructed as a metal ball grid array semiconductor package. In this embodiment, a single layer circuit board 32 made of glass-epoxy resin is used instead of the multi-layer circuit board 2 of the first embodiment. This arrangement is suited for IC chips which require a relatively small number of connecting pads, and, accordingly, the packaging arrangement can be made at a relatively low cost. In this embodiment, an IC chip 3 is attached to one side of a planar metal base 1 via a silicone resin bonding layer 4. The IC chip 3 is surrounded by a circuit board 32. The inner opening of the circuit board 2 is filled with a sealant 5, and the sealant is deposited beyond the height of the circuit board 32. A metal cap layer 6 is attached to the top surface (which is located at the lower end of the epoxy sealant layer 5 in FIG. 4) of the sealant layer 5. Bonding wires are connected between the bonding pads of the IC chip and the bonding pads formed on the circuit layer of the circuit board 2, and solder balls 9 are formed on corresponding electroconducitve lands of the surface circuit layer.

The above described embodiments were applied to ball grid array arrangements, but it is obvious for a person skilled in the art that the present invention can be equally applied to pin grid array arrangements simply by replacing the solder balls with terminal pins. If the surface of the IC chip opposing the metal base serves as a grounding pad, there will be no need for connecting the ground bonding pad of the IC chip to the metal base with a bonding wire if the IC chip is attached to be metal base with an electroconductive bonding layer. According to the first embodiment, because the pins projecting from the aluminum base can suffice for the grounding connections, it is possible to totally eliminate any other grounding connections.

Figure 5:
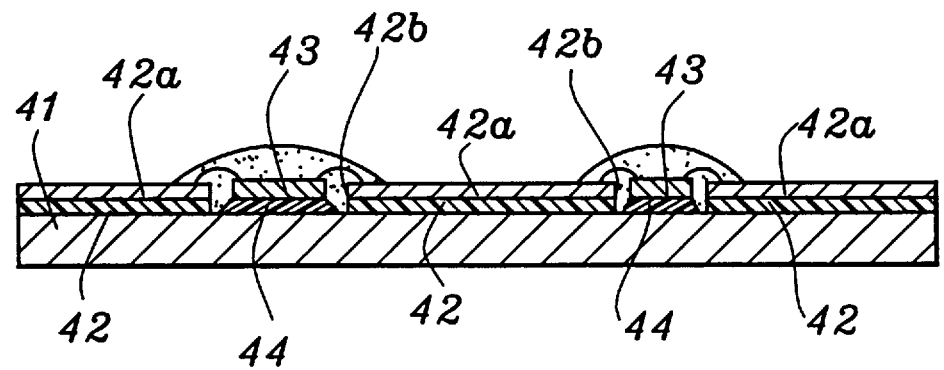
FIG. 5 is a view similar to FIG. 4 showing a third embodiment of the present invention.

FIG. 5 shows a third embodiment of the present invention applied to a metal circuit board arrangement. An insulating layer 42 is formed over the surface of a metal base 41, and a circuit layer 42a consisting of an electroconductive layer is formed over the surface of the insulating layer 42. A number of openings 42b are formed in the insulating layer 42, and electronic components 43, which may consist of passive chip components or semiconductor chip components, are each attached to the surface of the metal base 1 exposed by the corresponding opening 42b via a resin bonding layer 44. The resin bonding layer 4 is provided with the properties discussed in conjunction with the resin layer 4 of the first embodiment.

Figure 6:
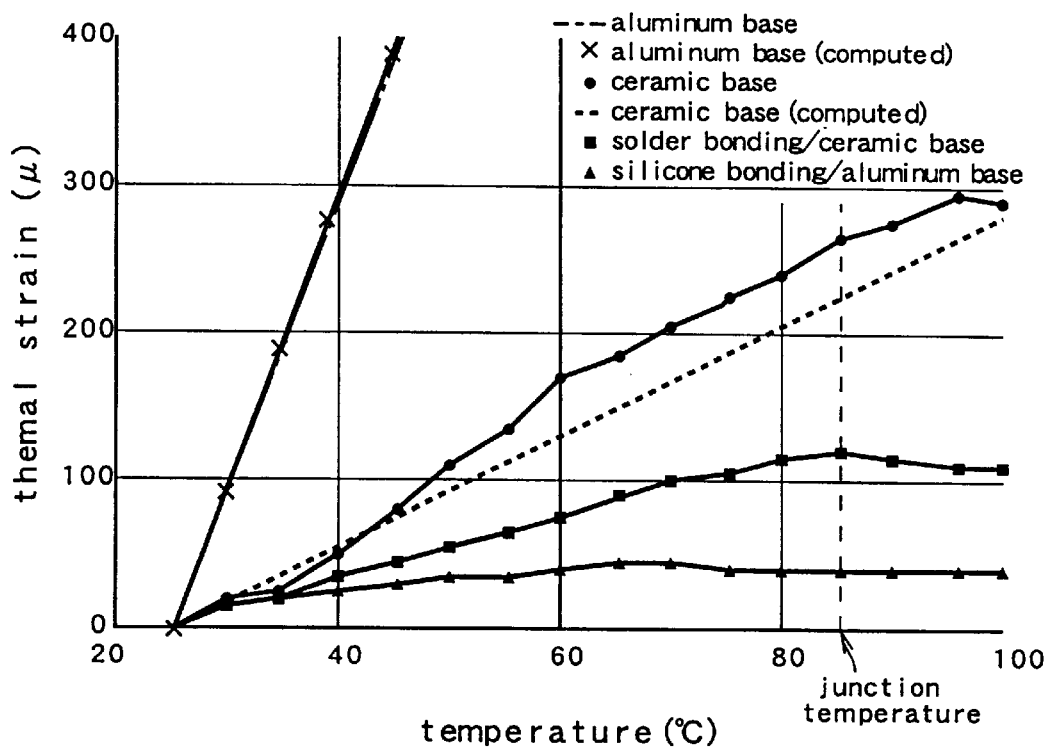
FIG. 6 is a graph comparing the thermal strain applied to the IC chip when different base materials are used.
Figure 7:
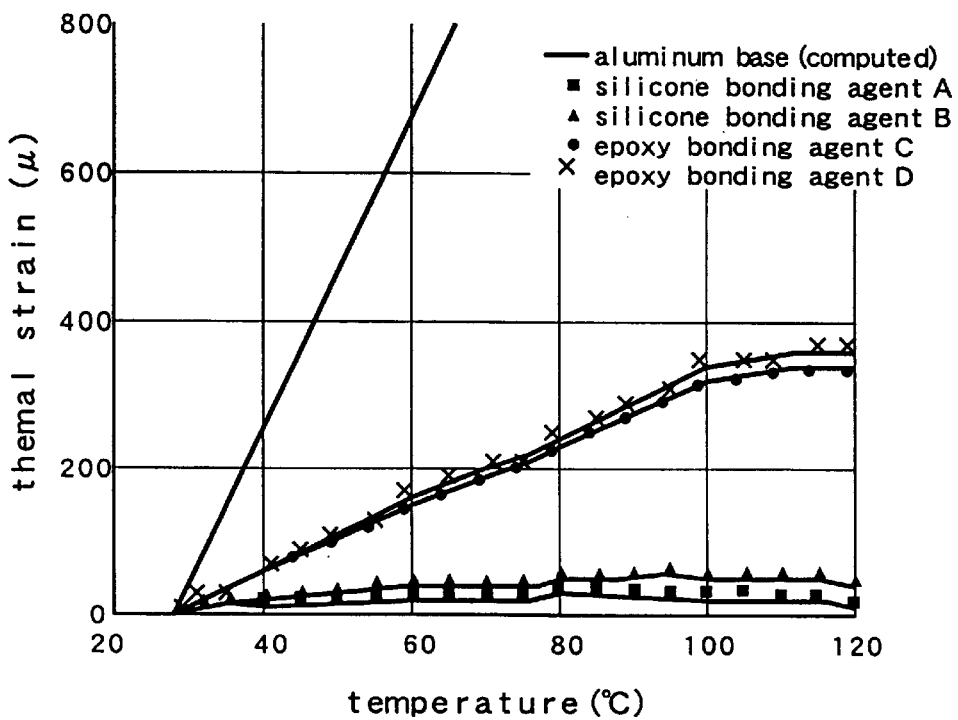
FIG. 7 is a graph showing the thermal strain applied to the IC chip when different bonding agents are used for attaching the IC chip to an aluminum base.

FIGS. 6 and 7 compare the thermal strains of an IC chip when it is attached to a metal base and a ceramic base by using different bonding methods including those using the resin bonding layer according to the present invention, solder, and epoxy bonding agents. The material properties of the silicone resin bonding agents according to the present invention, and the epoxy resin bonding agents for comparison are summarized in Table 2.

TABLE 2

| | silicone bonding agent | epoxy bonding agent | |
| --- | --- | --- | --- |
| | mixed with silver filler | without filler | with silver filler |
| | A | B | C | D |
| Young's modulus (kgf/cm$^2$) | 100 | 200 | 5000 | 5000 |
| elongation (%) | 50 | 30 | 5 | 5 |
| bonding shear strength (kgf/cm$^2$) | 35 | 23 | 200 | 94 |
| thermal conductivity (W/m · K) | 1.3 | 2.1 | 1.02 | 2.8 |

The comparison test was conducted by attaching a 12 mm by 12 mm IC chip centrally onto a surface of a 40×40×1.0 mm aluminum metal base and a ceramic base of a same size. A temperature compensated strain gauge was attached to the surface of the IC chip. This testing fixture was placed in an oven, and the resulting thermal strain was measured over the temperature range of from 25° C. (ambient temperature) to 120° C. at the increment of 5° C.

The results shown in FIG. 6 indicate that the arrangement according to the present invention gives rise to a substantially controlled thermal strain comparable to that produced when the IC chip is soldered to a ceramic base having a thermal expansion coefficient similar to that of the IC chip. The steep chain dot line and the "x" plots correspond to the measured and computed thermal strain of the aluminum base itself. The graph also includes the curves corresponding to the computed and measured thermal strains of a ceramic base itself.

FIG. 8 indicates that the present invention produces substantially smaller thermal strains than the arrangements in which the IC chip is mounted on an aluminum base by using epoxy bonding agents. Cyclic heat loading was also applied to the various fixtures, and it was found that the epoxy bonding agents degraded (separation of the IC chip and development of cracks in the bonding agent layer) in time due to thermal stress and absorption of moisture. On the other hand, the fixture according to the present invention using the resilient and heat conductive bonding agents consistently performed satisfactorily, and did not result in any defective conditions.

Thus, according to the present invention, the base may be made of a metal or an alloy such as aluminum which has a capability to favorably dissipate heat but has a large thermal expansion coefficient while avoiding the problem of causing excessive thermal strain to the electronic component because the resiliency of the bonding layer accommodates the thermal strain of the metal base. Because the bonding layer is highly heat conductive, the heat produced in the electronic component chip can be favorably transmitted to the metal base. It is therefore possible to achieve a high reliability in the packaging of semiconductor devices or the like at a minimum cost.

Although the present invention has been described in terms of specific embodiments thereof, it is possible to modify and alter details thereof without departing from the spirit of the present invention.

What we claim is:

1. A metallic electronic component packaging arrangement, comprising:

a metal base made of metal or alloy;

an electronic component chip securely mounted on said metal base with a bonding layer interposed between said chip and said metal base;

a circuit board placed on said metal base adjacent to said electronic component chip;

a bonding wire connected between a pad provided on said electronic component chip and a pad provided on said circuit board;

said bonding layer interposed between said metal base and said chip consisting of a resilient and heat conductive material which can prevent thermal strain of said metal base from adversely affecting said electronic component chip; and wherein said metal base is provided with a projection, and said circuit board is provided with a through hole which is adapted to receive said projection when said circuit board is mounted on said metal base.

2. A metallic electronic component packaging arrangement according to claim 1, wherein said projection is adapted to locate said circuit board on said metal base.

3. A metallic electronic component packaging arrangement according to claim 2, wherein said projection provides a path for connecting a pad of said circuit board to said metal base.

4. A metallic electronic component packaging arrangement according to claim 3, wherein said projection is formed by plastic deformation of said metal base.

5. A metallic electronic component packaging arrangement comprising:

a metal base made of metal or alloy;

an electronic component chip securely mounted on said metal base with a bonding layer interposed between said chip and said metal base;

a circuit board placed on said metal base adjacent to said electronic component chip;

a bonding wire connected between a pad provided on said electronic component chip and a pad provided on said circuit board;

said bonding layer interposed between said metal base and said chip consisting of a resilient and heat conductive material which can prevent thermal strain of said metal base from adversely affecting said electronic component chip;

wherein said resilient and heat conductive material comprises silicone resin mixed with metal powder;

wherein said metal base comprises a shallow rectangular pan, having a recessed surface and said circuit board comprises an annular circuit board with a central aperture, said circuit board being attached to said recessed surface and said electronic component chip being mounted in said aperture; and wherein an inner periphery of said circuit board, said electronic component chip and said bond wire are encapsulated with a resin sealant and are covered with a metal cap layer.

* * * * *